United States Patent [19]

Wu et al.

[11] Patent Number: 5,262,394
[45] Date of Patent: Nov. 16, 1993

[54] SUPERCONDUCTIVE ARTICLES INCLUDING CERIUM OXIDE LAYER

[75] Inventors: Xin D. Wu, Greenbelt, Md.; Ross E. Muenchausen, Espanola, N. Mex.

[73] Assignee: The United States of America as represented by the United States Department of Energy, Washington, D.C.

[21] Appl. No.: 813,726

[22] Filed: Dec. 27, 1991

[51] Int. Cl.[5] .............................................. B32B 9/00
[52] U.S. Cl. ........................................ 505/1; 505/701; 505/702; 428/688; 428/930; 428/457
[58] Field of Search .......................... 505/1, 701–704; 428/688, 688.1, 930

[56] References Cited

U.S. PATENT DOCUMENTS

| | | | |
|---|---|---|---|
| 4,983,515 | 1/1991 | Komuro | 505/1 |
| 5,047,388 | 9/1991 | Rohr | 505/1 |
| 5,087,605 | 2/1992 | Hegde et al. | 505/1 |

OTHER PUBLICATIONS

T. Inoue et al., "Epitaxial Growth of $CeO_2$ Layers on Silicon," Applied Physics Letters 56 (14), 1332–1333, Apr. 2, 1990.

H. Nagata et al., "Heteroepitaxial Growth of $CeO_2$ (001) Films on Si (001) Substrates by Pulsed Laser Deposition in Ultrahigh Vacuum," Japanese Journal of Applied Physics, 30 (6B), L1136–L1138, Jun. 1991.

C. T. Rogers et al., "Fabrication of Heteroepitaxial $YBa_2Cu_3O_{7-x}$—$PrBa_2Cu_3O_{7-x}$—$YBa_2Cu_3O_{7-x}$ Josephson Devices Grown by Laser Deposition," Applied Physics Letters 55 (19), 2032–2033, Nov. 6, 1990.

J. J. Kingston et al., "Multilayer $YBa_2Cu_3O_x$—$SrTiO_3$—$YBa_2Cu_3O_x$ Films for Insulating Crossovers," Applied Physics Letters 56 (2), 189–191, Jan. 8, 1990.

A. B. Berezin et al., "$Y_1Ba_2Cu_3O_{7-x}$ Thin Films Grown on Sapphire with Epitaxial MgO Buffer Layers," Applied Physics Letters 57 (1), 90–92, Jul. 2, 1990.

D. K. Fork et al., "High Critical Currents in Strained Epitaxial $YBa_2Cu_3O_{7-d}$ on Si," Applied Physics Letters 57 (11), 1161–1163, Sep. 10, 1990.

X. D. Wu et al., "Epitaxial Yttria-Stabilized Zirconia on (1101) Sapphire for $YB_2Cu_3O_{7-d}$ Thin Films," Applied Physics Letters 58 (3), 304–306, Jan. 21, 1991.

H. Myoren et al., "Crystalline Qualities and Critical Densities of As-Grown $Ba_2YCu_3O_x$ Thin Films on Silicon with Buffer Layers," Japanese Journal of Applied Physics, vol. 29, No. 6, L955–L957, Jun. 1990.

M. Yoshimoto et al., "In Situ Rheed Observation of $CeO_2$ Film Growth on Si by Laser Ablation Deposition in Ultrahigh-Vacuum," Japanese Journal of Applied Physics, vol. 29, No. 7, L1199–L1202, Jul. 1990.

X. D. Wu et al., "Expitaxial $OeO_2$ Films as Buffer Layers for High-Temperature Superconducting Thin Films," Applied Physics Letters 58, (19) 2165–2167, May 13.

K. M. Beauchamp et al., "Barrier Technology for Dysprosium Barium Copper Oxide ($DyBa_2Cu_3O_{7-x}$) Junctions and Related Structures," Chem. Abst. 114, (20): 197437Z.

Sahu et al, "Overview of High Tc Superconductivity" in Chemistry of High Tc Superpconductors, ACS 1988, 1985 Desk Manual, Microelectronic Manufacturing and Testing pp. 79–80.

Grant et al, Physica C, 185–189, 2099–2100 (1991) Originally presented in Kanazawa, Japan, Jul. 1991.

Cotton & Wilkinson, Advanced Inorganic Chemistry Wiley, New York, 1980, pp. 990–991.

*Primary Examiner*—Patrick J. Ryan
*Assistant Examiner*—Patrick R. Jewik
*Attorney, Agent, or Firm*—Bruce H. Cottrell; Paul D. Gaetjens; William R. Moser

[57] ABSTRACT

A ceramic superconductor comprising a metal oxide substrate, a ceramic high temperature superconductive material, and a intermediate layer of a material having a cubic crystal structure, said layer situated between the substrate and the superconductive material is provided, and a structure for supporting a ceramic superconducting material is provided, said structure comprising a metal oxide substrate, and a layer situated over the surface of the substrate to substantially inhibit interdiffusion between the substrate and a ceramic superconducting material deposited upon said structure.

19 Claims, 7 Drawing Sheets

SUPERCONDUCTIVE ARTICLES INCLUDING CERIUM OXIDE LAYER

FIELD OF THE INVENTION

The present invention relates to the field of superconducting thin films and more particularly to intermediate layers or buffer layers employed, e.g., in separating a superconducting thin film from a substrate. This invention is the result of a contract with the Department of Energy (Contract No. W-7405-ENG-36).

BACKGROUND OF THE INVENTION

Epitaxial superconducting thin films are sometimes desirable. The best epitaxial high-temperature superconducting thin films are obtained on only a few substrates such as $SrTiO_3$, $LaAlO_3$, MgO, and yttria-stabilized zirconia (YSZ). Although such superconducting films have excellent superconductive properties, none of those substrates are ideal for use in applications of, e.g., microwave devices, because of a high loss tangent and a high dielectric constant with $LaAlO_3$ and a poor lattice match for MgO and YSZ.

One approach to this problem has been to use a buffer or intermediate layer between the bulk substrate and the superconducting film. On substrates such as silica and sapphire, such buffer layers have been found necessary to prevent chemical reactions between the superconductor and the substrate. Among the buffer layers that have been previously tried are $PrBa_2Cu_3O_{7-x}$, $SrTiO_3$, $LaAlO_3$, MgO, YSZ, and $Y_2O_3$. Problems with most previous intermediate layers have included their multi-elemental composition thereby resulting in composition control during deposition, and a poor lattice match with either the substrate or the superconducting material. While MgO is a simpler intermediate layer, it also suffers from a large lattice mismatch with the superconductive films.

Accordingly, it is an object of this invention to provide an intermediate layer for superconductor-coated substrates, such an intermediate layer having chemical and structural compatibility to superconductors such as YBCO.

It is a further object of this invention to provide an intermediate layer-coated substrate that can then be coated with a superconductive film of, e.g., YBCO, such a substrate having chemical or structural compatibility to the superconductor.

Still another object of the invention is to provide a method of insulating between adjacent superconductive junctions by placing an intermediate layer of a intermediate layer such as $CeO_2$ between the adjacent superconductive junctions.

SUMMARY OF THE INVENTION

To achieve the foregoing and other objects, and in accordance with the purposes of the present invention, as embodied and broadly described herein, the present invention provides a ceramic superconductor comprising a metal oxide substrate, a ceramic high temperature superconductive material, and an intermediate layer selected from the group consisting of cerium oxide, curium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, and ytterbium oxide, preferably from the group of cerium oxide, gadolinium oxide, erbium oxide, europium oxide and praseodymium oxide, situated between said substrate and said superconductive material.

In another embodiment of the present invention, a ceramic superconductor is provided comprising a substrate, a ceramic high temperature superconductive material, and an intermediate layer selected from the group consisting of curium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, and ytterbium oxide, preferably an intermediate layer selected from the group consisting of gadolinium oxide, erbium oxide, europium oxide and praseodymium oxide, situated between said substrate and said superconductive material.

In another embodiment of the present invention, a structure for supporting a ceramic superconducting material is provided, said structure comprising a metal oxide substrate, and a layer of material selected from the group consisting of cerium oxide, curium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, and ytterbium oxide, preferably cerium oxide, gadolinium oxide, erbium oxide, europium oxide and praseodymium oxide situated over the surface of said substrate to substantially inhibit interdiffusion between said substrate and a subsequent ceramic superconducting material deposited upon said structure.

Another embodiment of the present invention provides a structure for supporting a ceramic superconducting material, said structure comprising a substrate, and a layer of material selected from the group consisting of curium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, and ytterbium oxide, preferably an intermediate layer selected from the group consisting of gadolinium oxide, erbium oxide, europium oxide and praseodymium oxide, situated over the surface of said substrate to substantially inhibit interdiffusion between said substrate and a subsequent ceramic superconducting material deposited upon said structure.

DETAILED DESCRIPTION

Figure 1A:
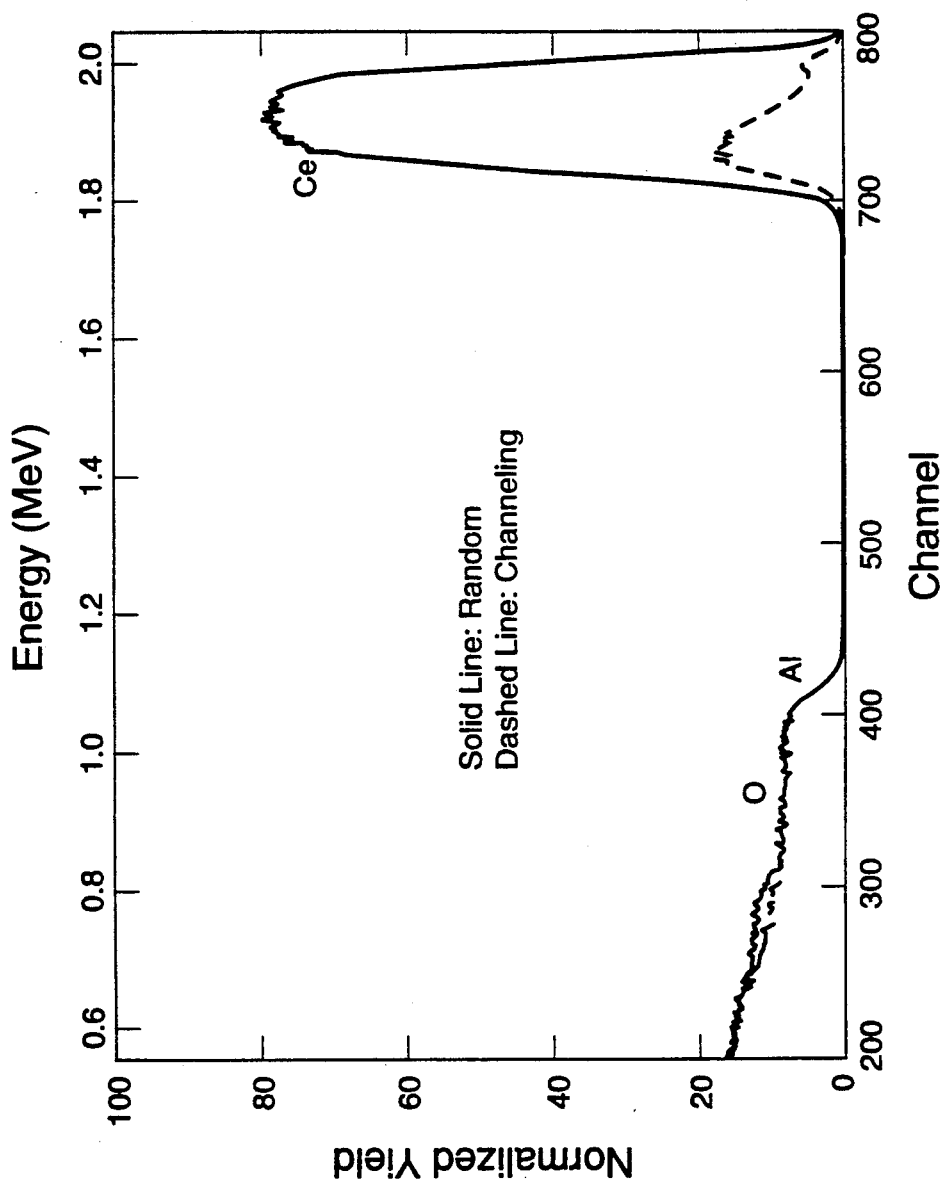
FIG. 1(a) is a graph of an ion beam RBS scan of a sample of cerium oxide upon sapphire.

The present invention concerns intermediate or buffer layers used in high temperature ceramic superconductors, particularly in the fabrication of substrate-supported thin film epitaxial high temperature superconductors, such as yttrium-barium-copper oxide (YBCO) and in the preparation of a structure for supporting a ceramic superconducting material, e.g., a substrate incompatible with a high temperature ceramic superconductor, such a substrate having a coating of the intermediate layer whereby the composite substrate is compatible with a high temperature ceramic superconductor. Such intermediate layers can generally include metal oxide materials having both structural and chemical compatibility with an underlying substrate and a overcoat layer of a ceramic high temperature superconductive material.

By "chemical compatibility" is meant that the intermediate layer does not undergo property-degrading chemical interactions with the substrate or the superconductive material. By "structural compatibility" is meant that the intermediate layer has a substantially similar lattice structure with the superconductive material.

Materials suitable as the base substrate, i.e., the underlying substrate material, can include metal oxide materials such as strontium-titanium oxide ($SrTiO_3$), yttria-stabilized zirconia (YSZ), lanthanum aluminum oxide ($LaAlO_3$), aluminum oxide (sapphire, either R-cut or M-cut), quartz, calcium-titanium oxide ($CaTiO_3$), and magnesium oxide (MgO). The metal oxide serving as the base substrate may also be a typical high temperature ceramic superconductive material such as YBCO and the like.

Among the suitable materials for the intermediate layers may generally be included those materials with a cubic crystal structure, e.g., cerium oxide ($CeO_2$), curium oxide ($Cm_2O_3$), erbium oxide ($Er_2O_3$), europium oxide ($Eu_2O_3$), iron oxide (beta-$Fe_2O_3$), gadolinium oxide ($Gd_2O_3$), holmium oxide ($Ho_2O_3$), indium oxide ($In_2O_3$), lanthanum oxide ($La_2O_3$), manganese oxide (beta-$Mn_2O_3$), lutetium oxide ($Lu_2O_3$), neodymium oxide ($Nd_2O_3$), praseodymium oxide ($Pr_2O_3$), plutonium oxide ($Pu_2O_3$), samarium oxide ($Sm_2O_3$), terbium oxide ($Tb_2O_3$), thallium oxide ($Tl_2O_3$), thulium oxide ($Tm_2O_3$), and ytterbium oxide ($Yb_2O_3$). The preferred intermediate layer materials include cerium oxide, erbium oxide, europium oxide, gadolinium oxide, and praseodymium oxide. The most preferred intermediate layer material is cerium oxide.

The intermediate layer can be deposited upon the substrate, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition (CVD), organometallic chemical vapor deposition (OMCVD), plasma enhanced chemical vapor deposition (PECVD), molecular beam epitaxy (MBE), a sol-gel process, and liquid phase epitaxy. In some instances, one or more layers of other materials may be inserted between the intermediate layer and the substrate and the intermediate layer would then be deposited upon the other material.

In a pulsed laser deposition process, powder of the desired intermediate material, e.g., cerium oxide, can be initially pressed into a disk or pellet under high pressure, generally above about 1000 pounds per square inch (PSI) and the pressed disk then sintered in an oxygen atmosphere or an oxygen-containing atmosphere at temperatures above about 1000° C. for at least about 1 hour, preferably from about 12 to about 24 hours. An apparatus suitable for the pulsed laser deposition is shown in Appl. Phys. Lett. 56, 578 (1990), "Effects of beam parameters on excimer laser deposition of $YBa_2Cu_3O_{7-x}$", such description hereby incorporated by reference.

Suitable conditions for pulsed laser deposition include, e.g., the laser, such as an excimer laser (20 nanoseconds (ns), 308 nanometers (nm)), targeted upon a rotating pellet of the intermediate material at an incident angle of about 45°. The target substrate can be mounted upon a heated holder rotated at about 0.5 rpm to minimize thickness variations in the resultant film. The substrate can be heated during the deposition at temperatures from about 600° C. to about 950° C., preferably from about 700° C. to about 850° C. An oxygen atmosphere of from about 0.1 millitorr (mTorr) to about 10 Torr, preferably from about 100 to about 250 mTorr, can be maintained within the deposition chamber during the deposition. Distance between the substrate holder and the pellet can be from about 4 centimeters (cm) to about 10 cm. In the case of sapphire as a substrate, the intermediate layers may be deposited at oxygen pressures of about 350 mTorr and temperatures of about 900° C. to promote the formation of (100) oriented intermediate layers.

The rate of the deposited film can be varied from about 0.1 angstrom per second (A/s) to about 200 A/s by changing the laser repetition rate from about 1 hertz (Hz) to about 200 Hz. As laser beam divergence is a function of the repetition rate, the beam profile is monitored after any change of repetition rate and the lens focal distance adjusted to maintain a constant laser energy density upon the target pellet. Generally, the laser beam can have dimensions of about 3 millimeters (mm) by 4 mm with an average energy density of about 1 to 2 joules per square centimeter ($J/cm^2$). After deposition, the films generally are cooled to 200° C. typically within an oxygen atmosphere of greater than about 100 Torr for about 15 to about 30 minutes.

Among the suitable superconductive materials are those superconductive materials having a critical transition temperature ($T_c$) of greater than about 20 °Kelvin (K). Among the materials with such a $T_c$ are included, e.g., yttrium-barium-copper oxide ($YBa_2Cu_3O_{7-x}$), bismuth-strontium-calcium-copper oxide, thallium-barium-calcium-copper oxide, neodymium-cerium-copper oxide and bismuth-potassium-barium oxide (BKBO).

The superconductive layer can be deposited upon the intermediate layer by, e.g., pulsed laser deposition, under conditions similar to the deposition of the intermediate layer. In some instances, one or more layers of other materials may be inserted between the intermediate layer and the superconductive layer and the superconductive layer would then be deposited upon the other material.

The present invention generally involves situating the intermediate materials described herein between a substrate material and a superconductive material. It is contemplated that other layers may be inserted between, e.g., the intermediate layer and either or both the base substrate and the ceramic superconductive material, without departing from the present invention. Similarly, where the intermediate material is initially situated over a substrate that will be subsequently overcoated with a superconductive material, it is contemplated that other layers may be inserted between the intermediate layer and the base substrate.

The present invention is more particularly described in the following examples which are intended as illustrative only, since numerous modifications and variations will be apparent to those skilled in the art.

The coatings of the intermediate layers and the superconductive material were characterized by x-ray diffraction, x-ray pole figure scan, Rutherford backscattering spectroscopy (RBS), and channeling using a goniometer with three axial rotations and two translations. The superconducting properties were measured by an inductive method and a direct transport method.

EXAMPLE 1

Figure 1B:
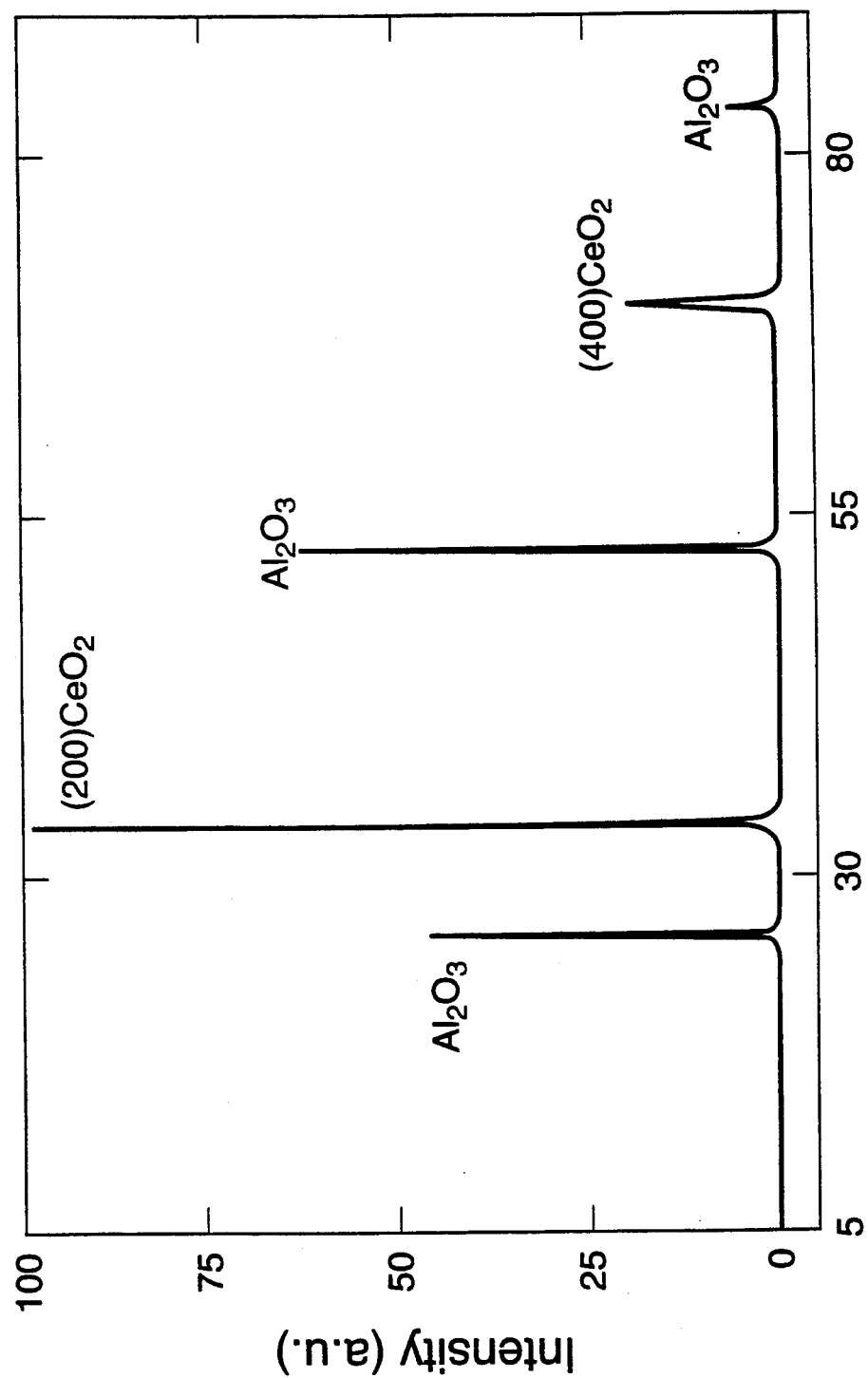
FIG. 1(b) is a graph of an x-ray diffraction pattern from a sample of cerium oxide upon sapphire.
Figure 2:
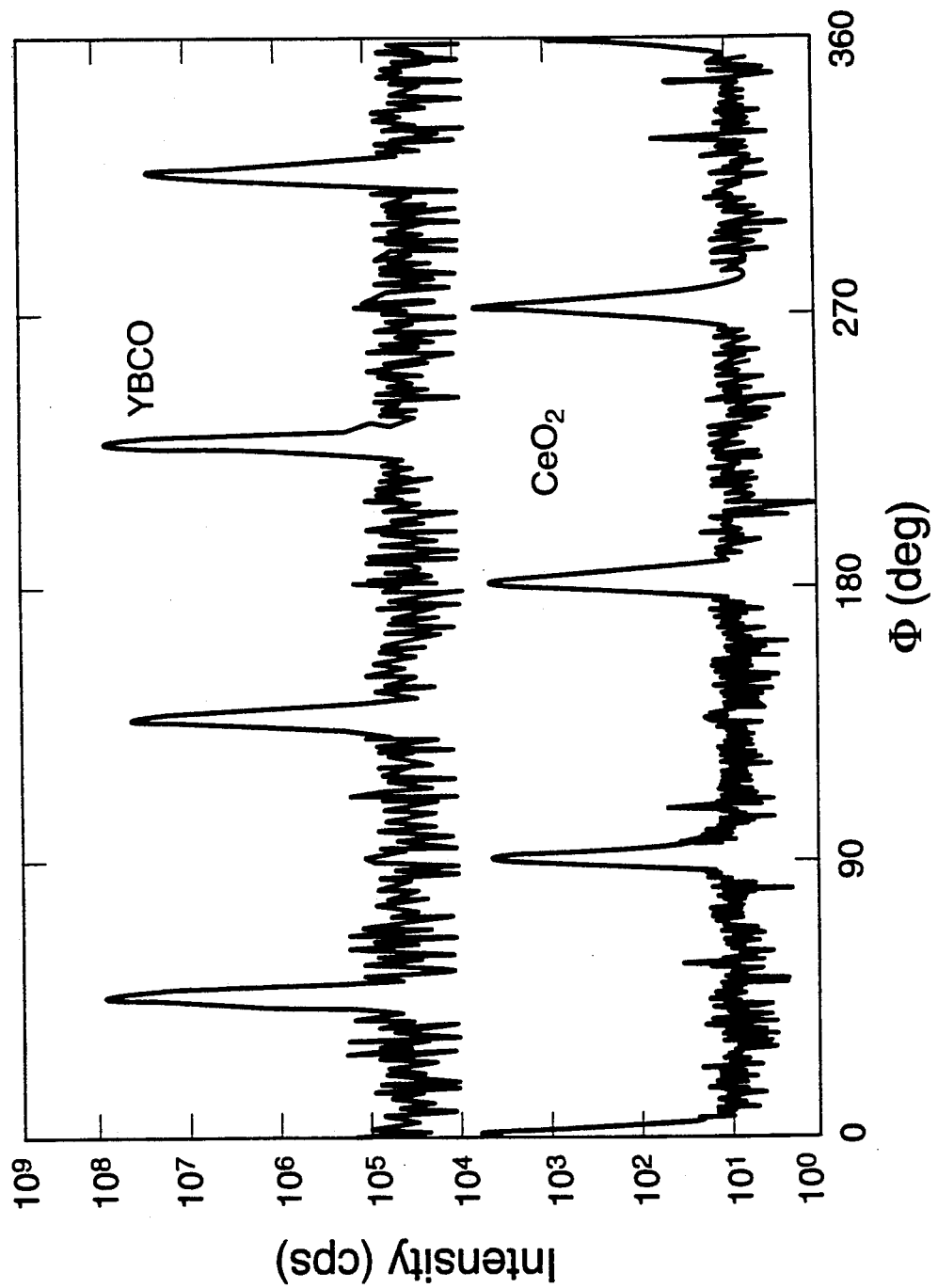
FIG. 2 is a graph of phi scan data from an x-ray pole figure scan of a sample of YBCO upon cerium oxide.
Figure 3:
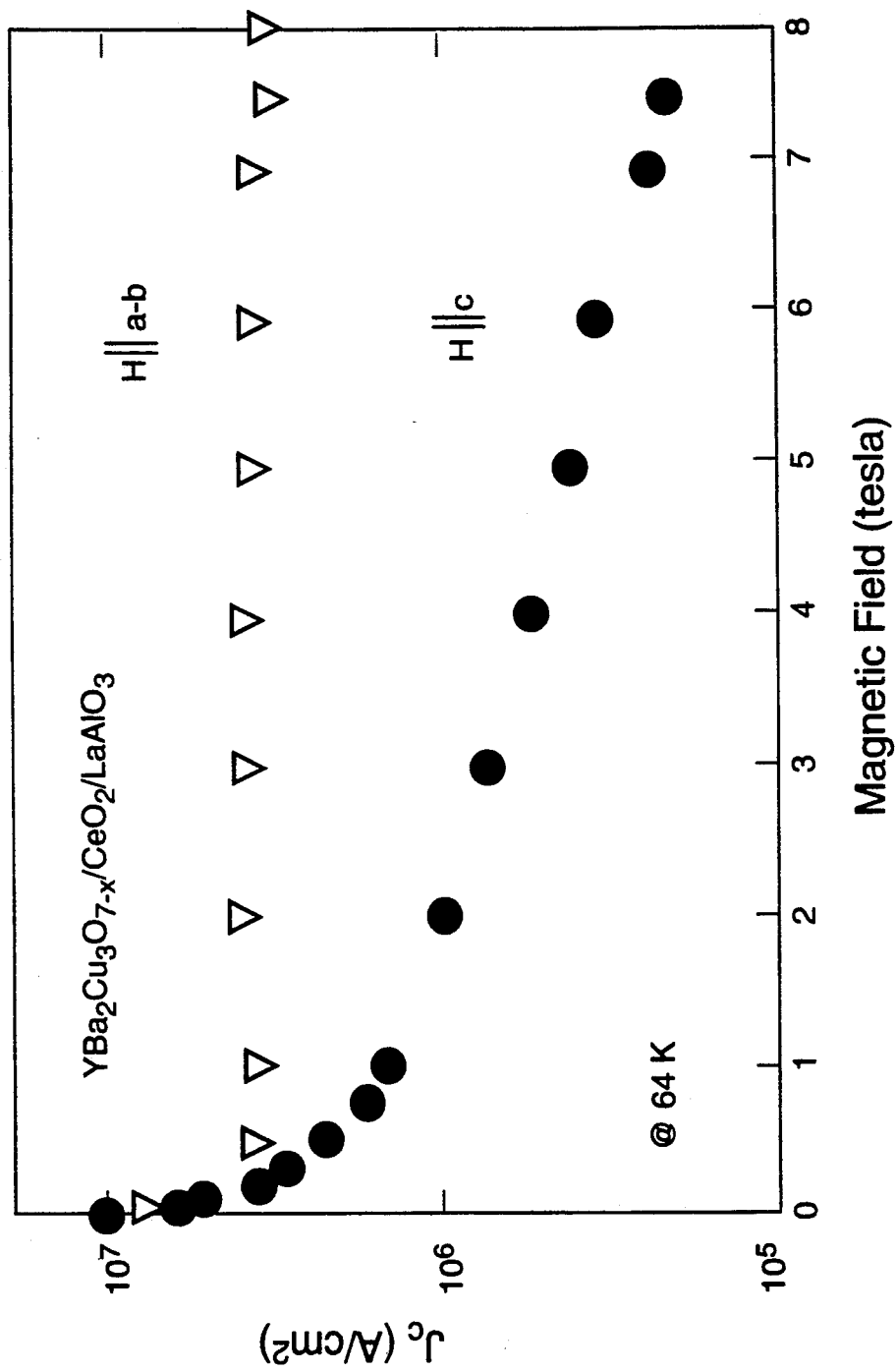
FIG. 3 is a graph of critical current versus magnetic field for a sample of YBCO upon cerium oxide upon lanthanum-aluminum oxide.

Cerium oxide powder (99.99%) was pressed into disks under 1 ton pressure and then sintered in oxygen at 1500° C. for 10 hours. Pulsed laser deposition was used to deposit a layer of the cerium oxide upon (1102)$Al_2O_3$ (R-cut sapphire) under a pressure of 0.15 Torr and a temperature of 785 ° C. Analysis of the resulting article by ion beam RBS and x-ray diffraction gave the results illustrated in FIG. 1(a) and FIG. 1(b). These results indicated the alignment of the cerium oxide layer and the epitaxially structure of the cerium oxide. A top layer of YBCO was then deposited upon the cerium oxide layer by pulsed laser deposition. Analysis by x-ray pole figure scan gave the results illustrated in FIG. 2. These results indicated that a single in-plane orientation of the YBCO is obtained and that there was an approximate 45° rotation between the in-plane orientation of the cerium oxide layer and the in-plane orientation of the YBCO layer. Analysis for transport critical current density yielded the data illustrated in FIG. 3. The YBCO layer had a $J_c$ of about $1.08 \times 10^7$ amperes per square centimeter at 64° K under a zero magnetic field.

Cerium oxide was also deposited upon various other substrates including (100)$LaAlO_3$, (100)YSZ, and (100)MgO.

EXAMPLE 2

Figure 4:
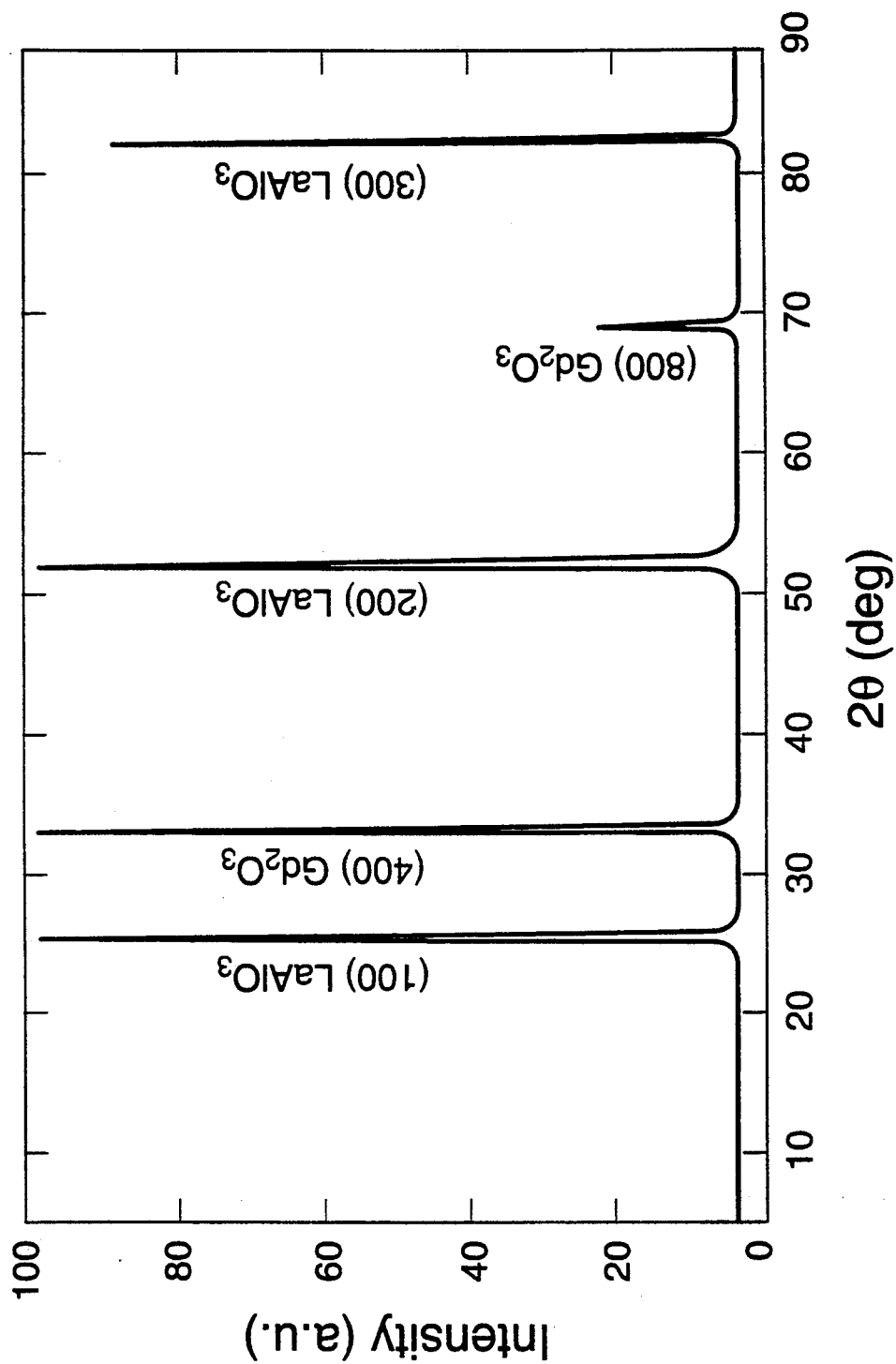
FIG. 4 is a graph of an x-ray diffraction pattern from a sample of gadolinium oxide upon sapphire.

Gadolinium oxide powder (99.99%) was pressed into disks under 1 ton pressure and then sintered in oxygen at 1200° C. for 24 hours. Pulsed laser deposition was used to deposit a layer of the gadolinium oxide upon (100)$LaAlO_3$. The conditions for the pulsed laser deposition were a laser energy density upon the oxide target of about 2 J/cm$^2$ with oxygen pressure about 150-200 mTorr and substrate temperature about 750°-800° C. during deposition. The gadolinium oxide layer was from about 500 to about 1000 Angstroms in thickness. Analysis of the resulting article by x-ray diffraction gave the results illustrated in FIG. 4. These results indicated the desired crystalline orientation or alignment of the gadolinium oxide layer upon the substrate.

Gadolinium oxide was also deposited upon various other substrates including (100)YSZ and (1102)$Al_2O_3$ (R-plane sapphire). A top layer of YBCO was also deposited upon the gadolinium oxide layers by pulsed laser deposition. The $T_c$ of the YBCO layer was measured as about 89° K.

EXAMPLE 3

Figure 5:
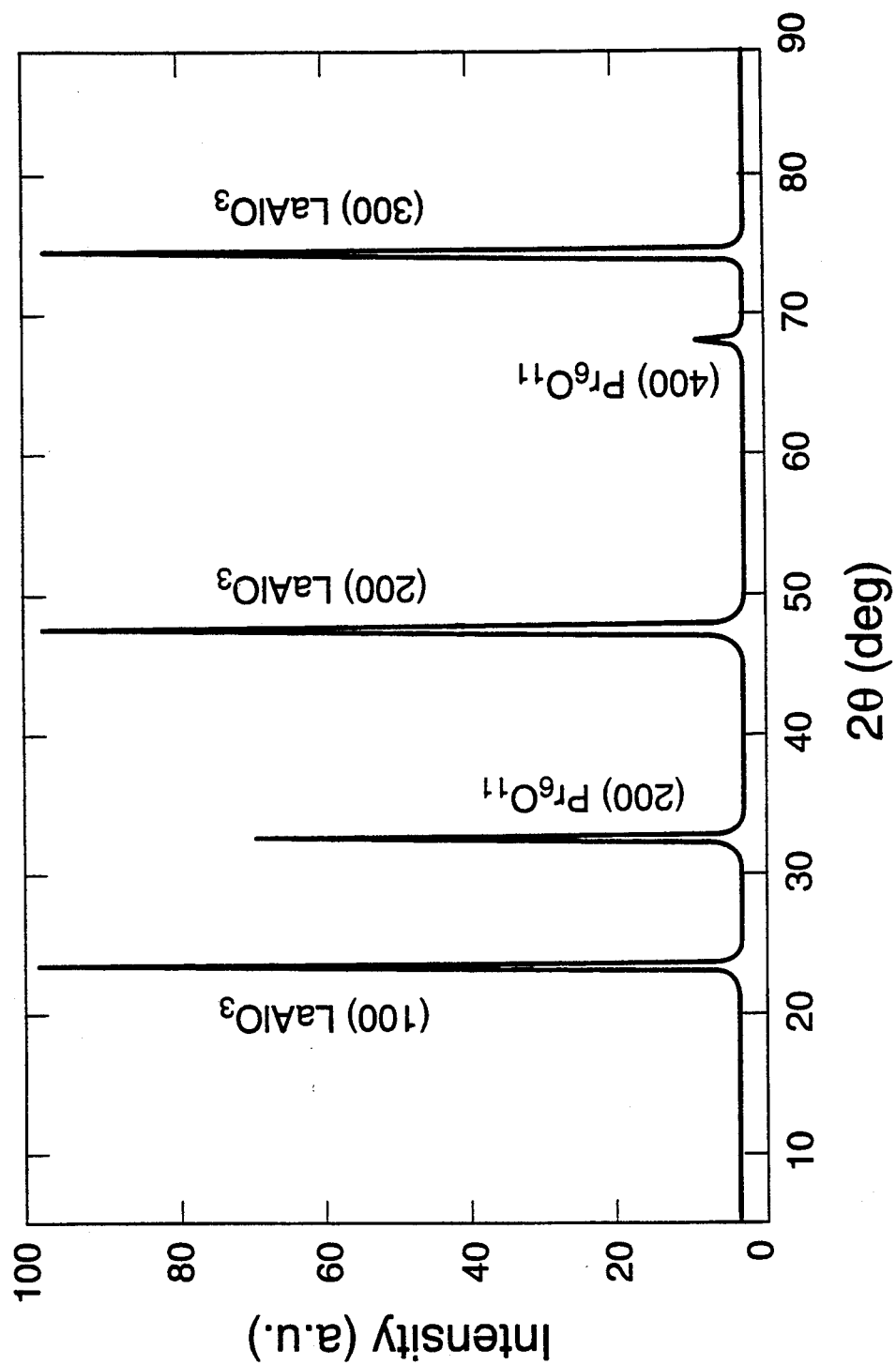
FIG. 5 is a graph of an x-ray diffraction pattern from a sample of praseodymium oxide upon sapphire.
Figure 6:
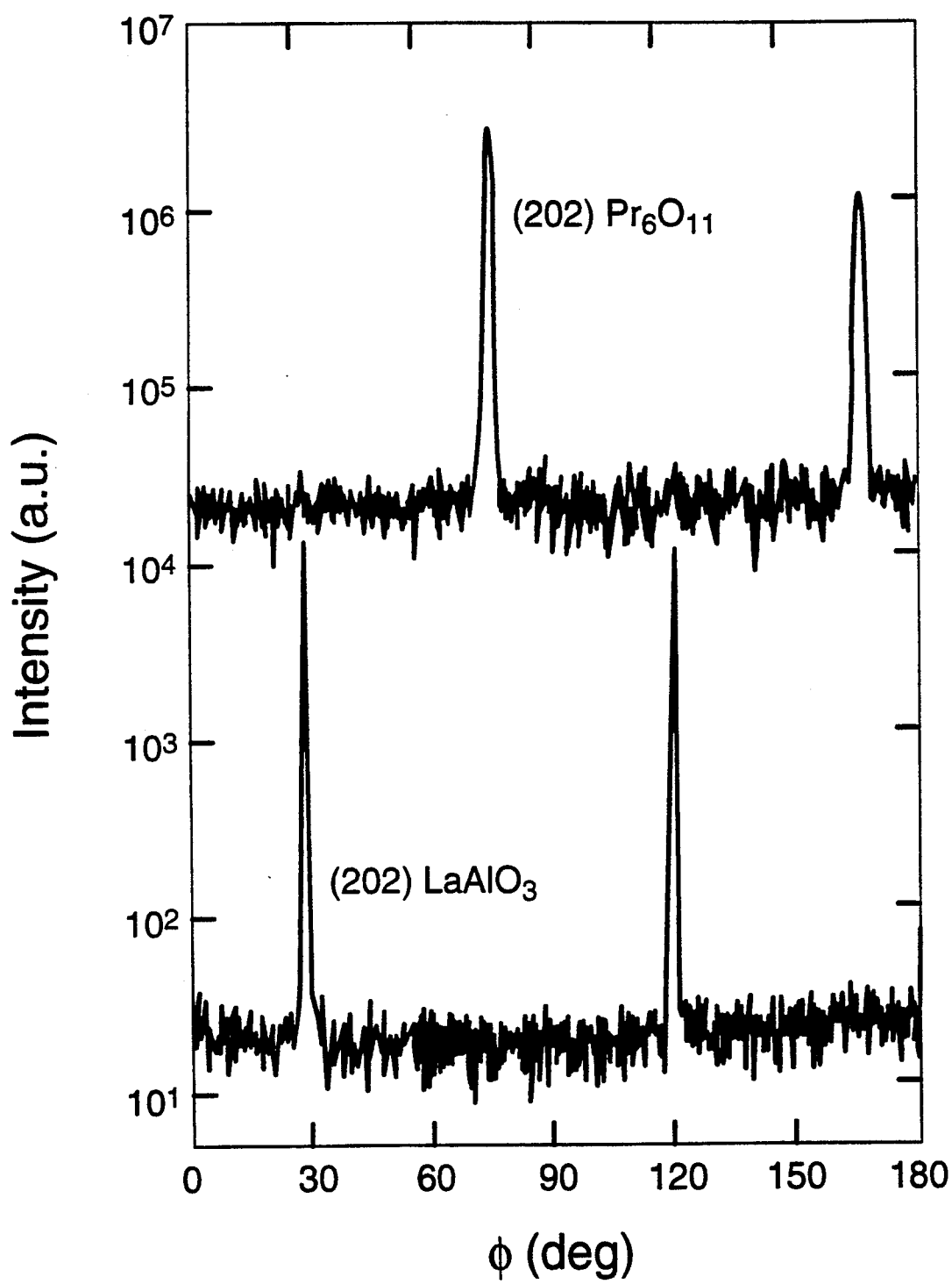
FIG. 6 is a graph of phi scan data from an x-ray pole figure scan of a sample of praseodymium oxide upon sapphire.

Praseodymium oxide ($Pr_6O_{11}$) powder (99.99%) was pressed into disks under 1 ton pressure and then sintered in oxygen at 1200° C. for 24 hours. Pulsed laser deposition as in example 2 was used to deposit a layer of the praseodymium oxide upon (1102)$Al_2O_3$ (R-plane sapphire). Analysis of the resulting article by x-ray diffraction and x-ray pole figure scan gave the results illustrated in FIG. 5 and FIG. 6. These results indicated the desired epitaxial orientation and the alignment of the gadolinium oxide layer upon the substrate. Praseodymium oxide was also deposited upon various other substrates including (100)$LaAlO_3$ and (100)YSZ. A top layer of YBCO was then deposited upon the praseodymium oxide layers by pulsed laser deposition.

The results of the present examples demonstrate that epitaxially oriented superconductive films can be deposited upon an intermediate layer material such as cerium oxide, gadolinium oxide, praseodymium oxide and the like, such an intermediate layer material upon, e.g., a metal oxide substrate such as sapphire. The resultant superconductive films have structural and chemical compatibility with the underlying intermediate layers whereby the superconductive films have high critical current density values.

Although the present invention has been described with reference to specific details, it is not intended that such details should be regarded as limitations upon the scope of the invention, except as and to the extent that they are included in the accompanying claims.

What is claimed is:

1. A ceramic superconductor comprising:
   a metal oxide substrate;
   an epitaxially oriented ceramic high temperature superconductive material selected from the group consisting of yttrium-barium-copper oxide, bismuth-strontium-calcium-copper oxide, thallium-barium-calcium-copper oxide, neodymium-cerium-copper oxide and bismuth-potassium-barium oxide; and,
   an intermediate layer selected from the group consisting of cerium oxide, curium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, and ytterbium oxide, having an epitaxial orientation and situated between said substrate and said superconductive material.

2. The ceramic superconductor of claim 1 wherein the intermediate layer is selected from the group consisting of cerium oxide, gadolinium oxide, erbium oxide, europium oxide and praseodymium oxide.

3. The ceramic superconductor of claim 1 wherein the metal oxide substrate is comprised of a material selected from the group consisting of strontium-titanium oxide, lanthanum-aluminum oxide, magnesium oxide, and yttria-stabilized zirconia.

4. The ceramic superconductor of claim 1 wherein the ceramic high temperature superconductive material is yttrium-barium-copper oxide.

5. The ceramic superconductor of claim 1 wherein the intermediate layer is situated adjacent the superconductive material.

6. A ceramic superconductor comprising:
   a substrate;
   a ceramic high temperature superconductive material selected from the group consisting of yttrium-barium-copper oxide, bismuth-strontium-calcium-copper oxide, thallium-barium-calcium-copper oxide, neodymium-cerium-copper oxide and bismuth-potassium-barium oxide; and, an intermediate layer selected from the group consisting of curium oxide, erbium oxide, europium oxide, gadolinium oxide, holmium oxide, manganese oxide, lutetium oxide, neodymium oxide, praseodymium oxide, plutonium oxide, samarium oxide, terbium oxide, thallium oxide, thulium oxide, and ytterbium oxide, situated between said substrate and said superconductive material.

7. The ceramic superconductor of claim 6 wherein the intermediate layer is selected from the group consisting of gadolinium oxide, erbium oxide, europium oxide and praseodymium oxide.

8. The ceramic superconductor of claim 6 wherein the substrate is comprised of a material selected from the group consisting of strontium-titanium oxide, lanthanum-aluminum oxide, magnesium oxide, and yttria-stabilized zirconia.

9. The ceramic superconductor of claim 6 wherein the ceramic high temperature superconductive material is yttrium-barium-copper oxide.

10. The ceramic superconductor of claim 6 wherein the ceramic superconductive material is oriented epitaxially.

11. The ceramic superconductor of claim 6 wherein the intermediate layer is situated adjacent to the superconductive material.

12. A structure for supporting a ceramic superconducting material, which comprises:
a metal oxide substrate; and,
a layer selected from the group consisting of gadolinium oxide and praseodymium oxide situated over the surface of said substrate to substantially inhibit interdiffusion between said substrate and a subsequent ceramic superconducting material selected from the group consisting of yttrium-barium-copper oxide, bismuth-strontium-calcium-copper oxide, thallium-barium-calcium-copper oxide, neodymium-cerium-copper oxide and bismuth-potassium-barium oxide deposited upon said structure.

13. The structure of claim 12 wherein the layer of material situated over the surface of the substrate is gadolinium oxide.

14. The structure of claim 12 wherein the metal oxide substrate is comprised of a material selected from the group consisting of strontium-titanium oxide, lanthanum-aluminum oxide, magnesium oxide, and yttria-stabilized zirconia.

15. A structure for supporting a ceramic superconducting material, which comprises:
a substrate; and,
a layer selected from the group consisting of curium oxide, erbium oxide, europium oxide, gadolinium oxide, holmium oxide, indium, manganese oxide, lutetium oxide, neodymium oxide, praseodymium oxide, plutonium oxide, samarium oxide, terbium oxide, thallium oxide, thulium oxide, and ytterbium oxide, situated over the surface of said substrate to substantially inhibit interdiffusion between said substrate and a subsequent ceramic superconducting material deposited upon said structure.

16. The structure of claim 15 wherein the layer of material situated over the surface of the substrate is selected from the group consisting of gadolinium oxide, erbium oxide, europium oxide and praseodymium oxide.

17. The structure of claim 15 wherein the metal oxide substrate is comprised of a material selected from the group consisting of strontium-titanium oxide, lanthanum-aluminum oxide, magnesium oxide, and yttria-stabilized zirconia.

18. In a high temperature superconductive device having one or more crossover junctions of ceramic high temperature superconductive material selected from the group consisting of yttrium-barium-copper oxide, bismuth-strontium-calcium-copper oxide, thallium-barium-calcium-copper oxide, neodymium-cerium-copper oxide and bismuth-potassium-barium oxide deposited upon said structure separated by an electrically insulating material, the improvement wherein said one or more crossover junctions of ceramic superconductive material is separated by a layer of material selected from the group consisting of cerium oxide, curium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, and ytterbium oxide.

19. The superconductive device of claim 18 wherein the layer of material separating the one or more crossover junctions is selected from the group consisting of cerium oxide, lanthanum oxide, erbium oxide, europium oxide and gadolinium oxide.

* * * * *